(12) United States Patent
DiBiase et al.

(10) Patent No.: US 7,924,408 B2
(45) Date of Patent: Apr. 12, 2011

(54) TEMPERATURE EFFECTS ON OVERLAY ACCURACY

(75) Inventors: Tony DiBiase, San Jose, CA (US); Mei H. Sun, Los Altos, CA (US); Mark Wiltse, Redwood City, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 843 days.

(21) Appl. No.: 11/690,813

(22) Filed: Mar. 24, 2007

(65) Prior Publication Data
US 2008/0204678 A1 Aug. 28, 2008

Related U.S. Application Data

(60) Provisional application No. 60/891,360, filed on Feb. 23, 2007.

(51) Int. Cl.
*G03B 27/58* (2006.01)
*G03B 27/32* (2006.01)

(52) U.S. Cl. ............................................. 355/72; 355/77

(58) Field of Classification Search .................... 355/77, 355/75, 72; 356/400
See application file for complete search history.

(56) References Cited

U.S. PATENT DOCUMENTS

| | | |
|---|---|---|
| 6,325,536 B1 | 12/2001 | Renken et al. |
| 6,577,914 B1 | 6/2003 | Bode |
| 7,065,737 B2 | 6/2006 | Phan et al. |
| 2005/0272221 A1 | 12/2005 | Yen et al. |

*Primary Examiner* — Peter B Kim
(74) *Attorney, Agent, or Firm* — Joshua D. Isenberg; JDI Patent

(57) ABSTRACT

A method for reducing overlay error in a photolithographic process, by providing a substrate having a permanent layer with a first pattern disposed therein, coating the substrate with photoresist, exposing the photoresist to a second pattern, while measuring temperatures at a plurality of different first positions across the substrate, developing the second pattern in the photoresist, measuring overlay errors between the first and second patterns at a plurality of different second positions across the substrate, correlating the overlay errors with temperatures by position on the substrate, determining any relationship indicated between the correlated overlay errors and temperatures, and adjusting at least one temperature controlling aspect of the photolithographic process in response to any relationship determined.

17 Claims, 1 Drawing Sheet

TEMPERATURE EFFECTS ON OVERLAY ACCURACY

FIELD

This invention claims benefit of prior pending provisional application Ser. No. 60/891,360, filed Feb. 23, 2007. This invention relates to the field of integrated circuit fabrication. More particularly, this invention relates to measuring the temperature at the substrate plane during photoresist exposure of the substrate, and correlating temperature with overlay accuracy.

BACKGROUND

Integrated circuits are typically fabricated in substrate form. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

The integrated circuits are typically fabricated using a basic process flow, that includes steps such as depositing a layer, forming a layer of photoresist over the layer, exposing and developing a pattern into the photoresist, and then modifying in some manner the underlying exposed layer through the photoresist, such as by etching the layer, after which the remaining photoresist layer is removed. Although this basic flow can be modified in a number of different ways, this basic process is repeatedly performed to create additional layers on the substrate, until the integrated circuits on the substrate are fabricated.

There is continual pressure to reduce the size of integrated circuits. This pressure comes from a number of different sources, such as the desire to have more circuitry within a given space, increase the number of dice on a substrate to as to increase profits, and reduce power consumption. As the critical dimensions of the integrated circuits continue to decrease, the problems that must be overcome in the fabrication process continue to increase.

For example, one problem is the proper alignment—from layer to layer—of the features that are formed in the various layers. At times past, such proper alignment could be ensured by merely producing a proper mask set, and paying strict attention to the alignment of the features from layer to layer. However, as new lithography processes are introduced that stretch the optical resolution of the light that is used to expose the photoresist, additional considerations need to be taken into account.

What is needed, therefore, is a system for overcoming problems such as those described above, at least in part.

SUMMARY

The above and other needs are met by a method for reducing overlay error in a photolithographic process, by providing a substrate having a permanent layer with a first pattern disposed therein, coating the substrate with photoresist, exposing the photoresist to a second pattern, while measuring temperatures at a plurality of different first positions across the substrate, developing the second pattern in the photoresist, measuring overlay errors between the first and second patterns at a plurality of different second positions across the substrate, correlating the overlay errors with temperatures by position on the substrate, determining any relationship indicated between the correlated overlay errors and temperatures, and adjusting at least one temperature controlling aspect of the photolithographic process in response to any relationship determined.

In this manner, subtle temperature variations across the surface of the substrate during photolithographic processing, such as might affect the overlay error of the process, can be detected and accounted for or otherwise corrected in the process.

In various embodiments according to this aspect of the invention, the substrate is an instrumented substrate having temperature sensors fabricated therein. The first and second patterns, in some embodiments, are identical patterns that align one on top of the other on the substrate. In other embodiments, the first and second patterns are different patterns. In some embodiments the permanent layer is an etched layer of at least one of an oxide, nitride, and metallic material. The temperature in some embodiments is measured at a given position on the substrate simultaneously with the exposure of the given position on the substrate.

According to another aspect of the invention there is described an apparatus for creating a thermal profile for a fabrication process, the apparatus having an instrumented substrate having temperature sensors fabricated therein, and a permanent layer overlying the temperature sensors, with a first pattern disposed in the permanent layer. In some embodiments according to this aspect of the invention, the temperature sensors are resistive thermal devices, and in other embodiments the temperature sensors are thermocouples. In some embodiments the permanent layer is an etched layer of at least one of an oxide, nitride, and metallic material.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

According to one embodiment of the present invention, photoresist patterns are aligned on an instrumented substrate, such as the PROCESS PROBE manufactured by SensArray Corporation of Santa Clara, Calif., while measuring temperature changes at different locations on the substrate. The information gathered is preferably used to trouble-shoot overlay errors caused by temperature fluctuations at the substrate plane.

Figure 1:
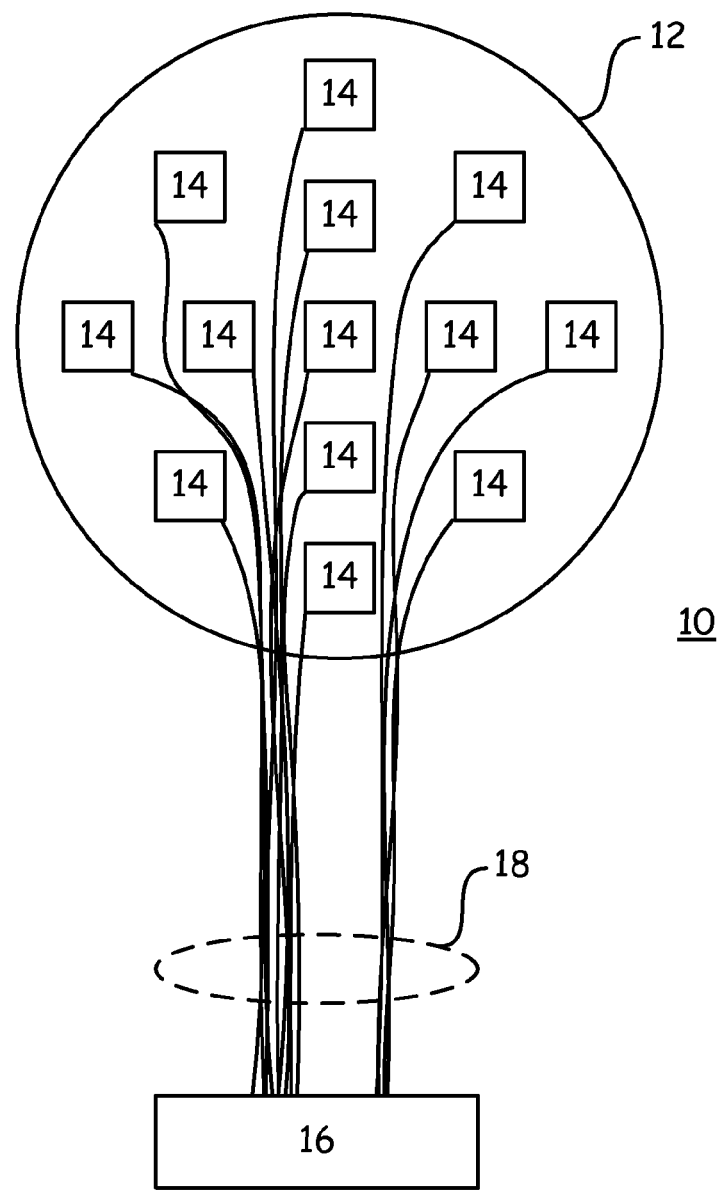
FIG. 1 is a top plan view of a substrate according to an embodiment of the present invention.

With reference now to FIG. 1, there is depicted one embodiment of a system 10 according to the invention, including a substrate 12. The substrate 12 preferably includes temperature sensors 14 that are disposed at various locations within the substrate 12. The exact number and location of the sensors 14 can be specified according to the needs of the process to be analyzed, as described with more particularity hereafter. The sensors 14 may be of different types, such as resistive thermal devices or thermocouples.

The sensors 14 are monitored by forming electrical connections between the sensors 14 and an instrument 16. One method of forming such electrical connections is by wiring the sensors 14 with a harness 18, as depicted in FIG. 1. However, in more preferred embodiments, the sensors 14, wiring, and associated on-substrate control system is hermetically sealed in the instrumented substrate 12. Thus, the instrumented substrate 12 is in these embodiments a self contained, hermetically-sealed system that transmits collected data wirelessly, and no external harness 18 is needed.

Figure 2:
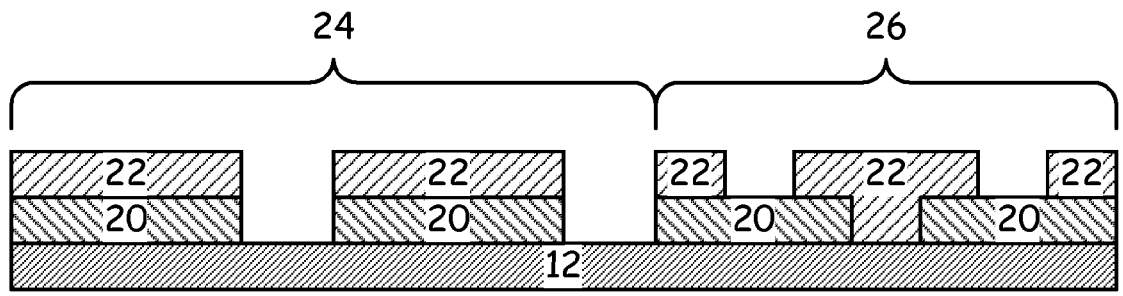
FIG. 2 is a cross sectional view of a substrate according to an embodiment of the present invention, with a permanently-etched layer and a patterned photoresist layer disposed thereon.

The substrate 12 is preferably modified by adding a layer 20 of an oxide or some other film, having a permanently-etched pattern, as depicted in FIG. 2. The sensors 14 are not depicted in FIG. 2, but preferably reside somewhere below the layer 20. The permanently-etched pattern layer 20 comprises Part 1 of a two-part overlay structure in this embodiment. By "permanent," it is not meant that there is absolutely no way to remove the layer 20 from the substrate 12. Rather, it is meant that the layer 20 is not substantially removed, eroded, or otherwise modified by the normal use of the substrate 12, as described in more detail below. However, the layer 20 can preferably be removed by other means. Such removal might be performed when there is a desire to change the pattern in the layer 20, to change the material of which the layer 20 is formed, or to renew the layer 20 after it has become worn or otherwise damaged through use over time.

Part 2 of the overlay structure is a patterned and developed layer of photoresist 22. The photoresist layer 22 is preferably formed by coating the substrate 12 with a layer of photoresist 22, soft baking the layer of photoresist 22, exposing the photoresist layer 22, developing the photoresist layer 22, and optionally hard baking the photoresist layer 22. A method for applying the photoresist layer 22 other than spinning may need to be used, for those embodiments where an electrical harness 18 is used as the electrical connection to the substrate 12.

The temperature of the substrate 12 is preferably measured during various phases of the photoresist process, such as during the exposure process. In this manner, a thermal profile of the substrate 12 can be developed, where the temperature at different positions on the substrate 12 is measured and recorded in association with the position at which the temperature was measured. This information can be gathered and recorded, such as in a data base, for many different process steps and for many different substrates 12, as desired. Alternately, sensors could be placed on the back of a standard substrate, such as in or on the platen or chuck on which the standard substrate resides, to create the temperature profiles as described.

After the patterned photoresist layer 22 is formed over the permanently-etched layer 20, the overlay error between the permanently-etched layer 20 and the developed photoresist pattern 22 is measured. Overlay errors are the differences between the desired pattern in the photoresist layer 22 and the actual pattern in the photoresist layer 22. These differences can be determined in a number of different ways. For example, the pattern in the permanently-etched layer 20 might be the exact same pattern as that in the photoresist layer 22, as generally indicated by 24 in FIG. 2. In this case, differences between the two patterns can be measured directly.

Alternately or additionally, the pattern in the permanently-etched layer 20 might be a complimentary pattern to that in the photoresist layer 22, where the patterns are not exactly the same, but form structures that provide an easy reference one to another, such as interlaced lines, nesting boxes, and other such geometrical patterns, as generally indicated by 26 in FIG. 2. Thus, the pattern in the permanent layer 20 is preferably used as a reference to determine the overlay errors in the pattern of the photoresist layer 22.

The overlay errors as measured at various locations on the substrate 12 are preferably associated with the temperatures as measured at the same or nearby locations, to determine correlations between measured overlay error and measured temperature by location on the substrate 12. Although the temperature variations between the different locations of the substrate 12 during processing might be very slight, the temperature differences across the substrate 12 might still be sufficient to contribute to the problem of overlay error during the photolithography processes. Thus, any correlations that are detected between temperature and overlay error can be used to make process or instrument modifications, so as to reduce the overlay errors in future production processing.

The substrate 12 is preferably reused by cleaning off the photoresist layer 22 and repeating the processing as desired, such as at different process conditions. As mentioned above, the methods by which the photoresist layer 22 is removed from the substrate 12 preferably does not substantially modify the permanent layer 20 is any way.

While embodiments of the present are applicable to a wide variety of different processes, various embodiments of the present invention can be used, for example, in the characterization of immersion scanners, where the movement of the fluid meniscus causes temperature fluctuations due to evaporation or other effects. Embodiments of the invention can also be applied to dry scanning.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for reducing overlay error in a photolithographic process, the method comprising the steps of:
    providing a substrate having a permanent layer with a first pattern disposed therein,
    coating the substrate with photoresist,
    exposing the photoresist to a second pattern, while measuring temperatures at a plurality of different first positions across the substrate,
    developing the second pattern in the photoresist,
    measuring overlay errors between the first and second patterns at a plurality of different second positions across the substrate,
    correlating the overlay errors with temperatures by position on the substrate,
    determining any relationship indicated between the correlated overlay errors and temperatures, and
    adjusting at least one temperature controlling aspect of the photolithographic process in response to any relationship determined.

2. The method of claim 1, wherein the substrate is an instrumented substrate having temperature sensors fabricated therein.

3. The method of claim 1, wherein the first and second patterns are identical patterns that align one on top of the other on the substrate.

4. The method of claim 1, wherein the first and second patterns are different patterns.

5. The method of claim 1, wherein the permanent layer is an etched layer of at least one of an oxide, nitride, and metallic material.

6. The method of claim 1, wherein the temperature is measured at a given position on the substrate simultaneously with the exposure of the given position on the substrate.

7. A method for reducing overlay error in a photolithographic process, the method comprising the steps of:
provide a substrate having a permanent layer with a first pattern disposed therein, where the substrate is an instrumented substrate having temperature sensors fabricated therein,
coating the substrate with photoresist,
exposing the photoresist to a second pattern, while measuring temperatures at a plurality of different first positions across the substrate, where the temperature is measured at a given position on the substrate simultaneously with the exposure of the given position on the substrate,
developing the second pattern in the photoresist,
measuring overlay errors between the first and second patterns at a plurality of different second positions across the substrate,
correlating the overlay errors with temperatures by position on the substrate,
determining any relationship indicated between the correlated overlay errors and temperatures, and
adjusting at least one temperature controlling aspect of the photolithographic process in response to any relationship determined.

8. The method of claim 7, wherein the first and second patterns are identical patterns that align one on top of the other on the substrate.

9. The method of claim 7, wherein the first and second patterns are different patterns.

10. The method of claim 7, wherein the permanent layer is an etched layer of at least one of an oxide, nitride, and metallic material.

11. An apparatus for creating a thermal profile for a fabrication process, the apparatus comprising an instrumented substrate having temperature sensors fabricated therein, and a permanent layer overlying the temperature sensors, with a first pattern disposed in the permanent layer.

12. The apparatus of claim 11, wherein the temperature sensors include at least one of resistive thermal devices, thermocouples, integrated circuit sensors, and thermistors.

13. The apparatus of claim 11, wherein the instrumented substrate has a flatness and a thickness substantially equal to a production silicon substrate.

14. The apparatus of claim 11, wherein the permanent layer is an etched layer of at least one of an oxide, nitride, and metallic material.

15. The apparatus of claim 11, wherein the first pattern comprises an overlay structure.

16. The apparatus of claim 15, wherein the overlay structure includes a pattern that matches a corresponding pattern in a layer overlying the permanent layer.

17. The apparatus of claim 15 wherein the overlay structure includes structures that provide reference to corresponding structures in a layer overlying the permanent layer.

* * * * *